United States Patent [19]

Davis

[11] 4,401,950
[45] Aug. 30, 1983

[54] LOW-VOLTAGE, COMPLEMENTARY SYMMETRY CLASS B AMPLIFIER ARRANGEMENT

[75] Inventor: Darrell E. Davis, Sunrise, Fla.

[73] Assignee: Motorola, Inc., Schaumburg, Ill.

[21] Appl. No.: 213,285

[22] Filed: Dec. 5, 1980

[51] Int. Cl.³ .................................................. H03F 3/45
[52] U.S. Cl. ...................................... 330/255; 330/257
[58] Field of Search ................................ 330/255, 257

[56] References Cited

U.S. PATENT DOCUMENTS

| | | | |
|---|---|---|---|
| 3,077,566 | 2/1963 | Vosteen | 330/260 |
| 3,551,836 | 12/1970 | Greeson, Jr. | 330/257 |
| 3,995,229 | 11/1976 | Stehlin et al. | 330/257 X |
| 4,021,746 | 5/1977 | Suzuki | 330/253 |
| 4,027,272 | 5/1977 | Kimura | 330/69 X |
| 4,068,183 | 6/1978 | Horinaga | 330/253 |
| 4,087,761 | 5/1978 | Fukumoto et al. | 330/267 |
| 4,164,716 | 8/1979 | Dague et al. | 330/255 X |
| 4,167,708 | 9/1979 | Goto | 330/263 |
| 4,176,323 | 11/1979 | Odell | 330/263 |
| 4,335,358 | 6/1982 | Hoeft | 330/257 X |

FOREIGN PATENT DOCUMENTS

| | | | |
|---|---|---|---|
| 561280 | 8/1977 | U.S.S.R. | 330/257 |
| 601799 | 4/1978 | U.S.S.R. | 330/257 |

*Primary Examiner*—James B. Mullins
*Attorney, Agent, or Firm*—Donald B. Southard; James W. Gillman

[57] ABSTRACT

A low-voltage, complementary symmetry amplifier arrangement is disclosed which functions effectively on supply voltages down to one volt DC. The amplifier is especially suited for audio processing applications in hand-held personal electronics apparatus, such as pocket radio receivers. The circuit configuration is easily implemented in integrated circuit form and operates efficiently on class B operation with its attendant advantages. The amplifier arrangement is characterized by the use of current sources in the collector and emitter circuits of a differential amplifier and thereby employs current ratios instead of the more conventional voltage levels to selectively control the conduction of associated output devices.

11 Claims, 2 Drawing Figures

4,401,950

LOW-VOLTAGE, COMPLEMENTARY SYMMETRY CLASS B AMPLIFIER ARRANGEMENT

BACKGROUND OF THE INVENTION

The present invention relates generally to amplifier arrangements and in particular to a low-voltage, complementary symmetry amplifier circuit particularly adapted for integrated circuit implementation and especially suited for audio processing applications.

There is, of course, a need for amplifier devices that are capable of handling significant current levels. Output amplifiers are but one example. In hand-held, personal communications apparatus, and in radio pocket pagers, in particular, such amplifiers may drive a loudspeaker or, in the case of a tone-only device, perhaps a transducer device of some sort.

In subminiature devices of this character, space requirements are, indeed, critical. However, of equal criticality, is power efficiency, since such apparatus must function from a self-contained battery source. Accordingly, this customarily dictates more than one output transistor device so as to permit class B operation, with its attendant current consumption efficiency in the output devices, under no signal input conditions. For stacked transistors of the same type, it is difficult to operate at low supply voltages, particularly below about 1.4 volts DC. Furthermore, a transformer is usually required which, in low-voltage supply applications, has a severely limited swing that the output transistors may effect. The transformer also consumes valuable space, adds weight, and reduces circuit efficiency due to its inherent internal losses.

Accordingly, a need exists for an amplifier arrangement which operates at low supply voltage, on the order of one volt, and which nevertheless avoids the high stand-by currents of prior devices. The amplifier should, except for the output transistor devices themselves, be easily implemented in integrated circuit form.

It is an object of the present invention to provide an improved low-voltage, complementary symmetry, class B audio amplifier arrangement operating efficiently on supply voltages of less than 1.4 volts DC.

It is another object of the present invention to provide an improved amplifier of the foregoing type which does not require a transformer as an integral component so as to allow circuit fabrication in a minimum of volume and cost.

Yet another object of the present invention is to provide an improved amplifier of the foregoing type which avoids low level output voltages.

SUMMARY OF THE INVENTION

In practicing the invention, a low-voltage, complementary symmetry, class B audio amplifier is provided which functions effectively on supply voltages down to approximately one volt DC, making it ideal for use in hand-held, personal communications appratus, such as pocket radio pagers, which customarily are powered from one cell batteries. The amplifier arrangement includes a conventional transistor differential amplifier wherein respective current sources are serially connected in the collector electrodes thereof with common connected emitter electrodes coupled through a third current source to ground. The current from the first and second current sources are unbalanced with respect to such other and together are substantially equal to or greater than the current of the third current source. Third and fourth transistors are provided which include an input coupled to a respective output collector of the differential transistor pair and, further, which are of the complementary type thereto. An additional transistor pair, transistors five and six, serve as the output devices. Transistors five and six are complementary to one another and are intended to be serially connected between the supply voltage and a reference potential with common connected collectors serving as the output of the amplifier device. The inputs of transistors five and six are coupled to the outputs of transistors three and four.

In one embodiment of the invention, and "AND" gate arrangement is provided between transistors five and six and current source two in a manner to ensure that only one of the output transistors five and six may conduct at any one time. This effectively minimizes power drain on the supply source.

BRIEF DESCRIPTION OF THE DRAWINGS

The features of the present invention which are believed to be novel are set forth with particularity in the appended claims. The invention itself, together with further objects and advantages thereof, may be best understood by reference to the following description when taken in conjunction with the accompanying drawings, in which:

DESCRIPTION OF THE PREFERRED EMBODIMENTS

Figure 1:
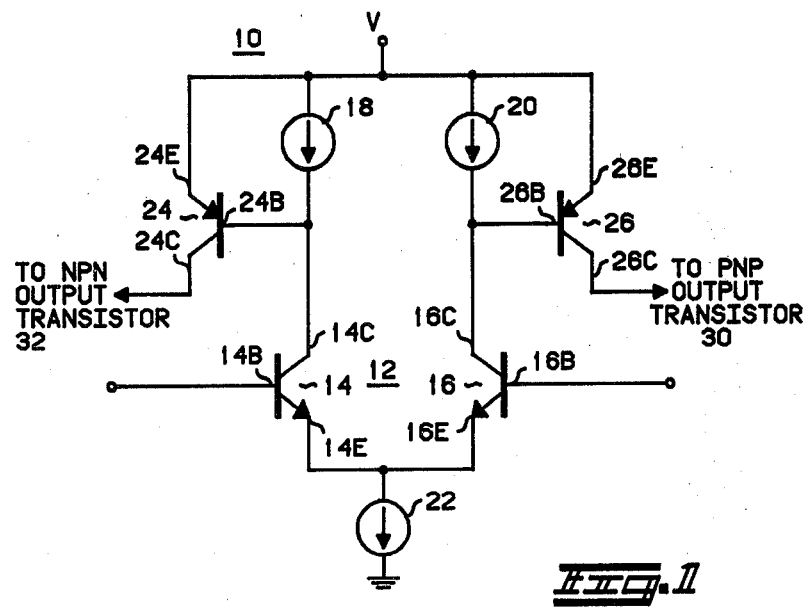
FIG. 1 is a schematic of an amplifier arrangement which has been constructed in accordance with the present invention and which is suitable for use as an audio amplifier driver stage.

Referring to the drawings, an amplifier arrangement is shown generally at 10 which amplifier has been constructed in accordance with the present invention. Amplifier 10 is suitable for use as a driver stage in connection with a pair of stacked complementary output transistors (see FIG. 2). Amplifier driver stage 10 is characterized in that it is operable from a low-voltage, single cell battery power source down to as low as one volt DC. It operates as class B to avoid any high stand-by current in the output transistors and no conventional transformer component is required.

Amplifier stage 10 includes a conventional differential amplifier 12 comprised of transistors 14 and 16 with base, emitter and collector electrodes as shown. A current source 18 is connected between a voltage source V and the collector 14C of transistor 14, while a current source 20 is similarly connected in the collector circuit of transistor 16. Emitters 14E and 16E are interconnected and coupled to ground through a third current source 22. A further transistor 24 is included having its base 24B connected to the collector 14C of transistor 14. Emitter 24E is connected to the power source V with its collector 24C forming the output to provide the current to one of the output transistors, here indicated as the NPN transistor (transistor 32 in FIG. 2) of a stacked NPN-PNP push-pull transistor pair. Similarly, a transistor 26 is included having a base 26B connected to the collector 16C of transistor 16, with emitter 26E being connected to the power source V. A collector 26C forms the output to provide current to the PNP output transistor (transistor 30 in FIG. 2).

The currents from current sources 18 and 20 are somewhat unbalanced with respect to each other and together are substantially equal to the current of the current source 22. Accordingly, a sharp transfer characteristic is established between transistors 14 and 16 which is effected upon any voltage unbalance on the respective input base electrodes 14B and 16B. This, in turn, causes rapid transitions in the output transistors 30-32. This is one of the novel aspects of this amplifier circuit in that it guarantees effective class B operation at low voltages.

At quiescence, with substantially the same voltage levels on the input base electrodes 14B and 16B, the collector currents of transistors 14 and 16 are substantially the same and are equal to the current sources 18 and 20, respectively. The sum of the current sources 18 and 20 equals that of the current source 22. Accordingly, transistors 24 and 26 are rendered non-conductive. Upon the applied signal voltage at input base electrode 14B, for example, being greater than that applied to the input base electrode 16B, an increase in current through collector 14C occurs. Since the current in current source 18 remains fixed, the difference or additional current is accounted for in the base current of transistor 24. The conduction of transistor 24 is then utilized to selectively control the associated output transistor device, here indicated as the NPN transistor 32. Conversely, if the voltage at base 16B is greater than that applied to input base 14B, then transistor 26 is rendered conductive with the resultant collector current thereof adapted for selective control of the other, or PNP, transistor 30.

As mentioned previously, it is necessary that a close ratio be maintained between the current sources 18, 20 and 22. That is, current source 18 should nearly equal current source 20 and the sum thereof should equal current source 22. If too great a disparity develops, it may well result in both of the output transistors 30 and 32 being on at the same time. This, of course, causes wasted battery power and other undesirable side effects. One way of preventing both output transistors 30 and 32 from being on at the same time is to provide some offset between the current sources 18 and 20. That is, have one of the reference current sources at some higher level than the other. This in turn results in an effective offset in input voltage drives of transistors 14 and 16 of differential amplifier 12. The transistor coupled to the higher current source will thereby require a somewhat higher input voltage to conduct than will the other transistor of the differential amplifier 12. This creates an effective "zone" of non-conduction for the output devices 30 and 32, depending on the degree of offset in the respective currents sources 18 and 20. This "zone" can be effectively varied by the amount of offset, or current that one current source is over the other, providing that the lesser current source is approximately one half the value of current source 22 in the common emitter path of differential amplifier 12.

Figure 2:
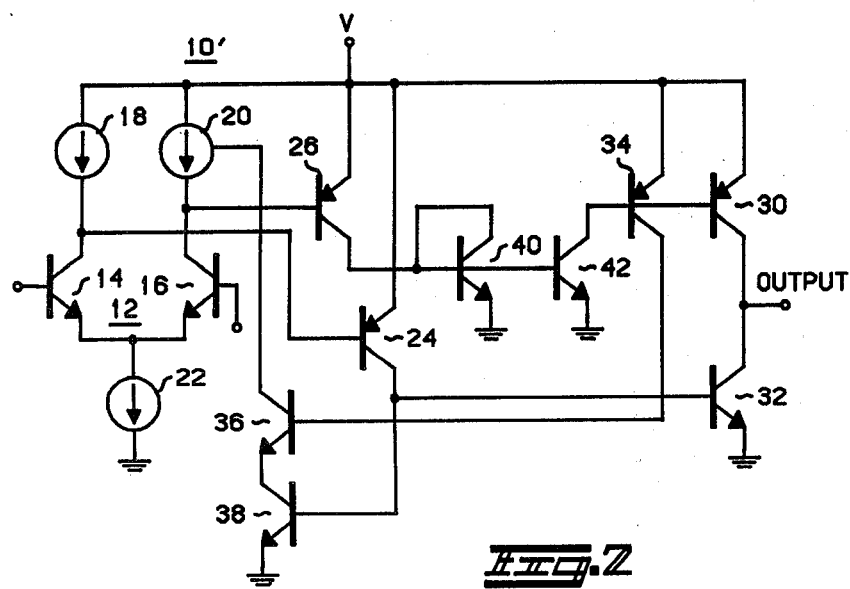
FIG. 2 is a schematic diagram of a complete amplifier arrangement which has been constructed in accordance with another embodiment of the invention.

FIG. 2 includes additional circuit features for still another embodiment of the present invention that insures only one of the output transistors of the output pair 30-32 will be on at any given time, without having any substantial offset between current sources 18 and 20.

In FIG. 2, like symbols are used to identify like element included in FIG. 1. In addition to output transistors 30 and 32, as previously described, transistors 34, 36 and 38 are also provided. Transistors 40 and 42, coupled between transistor 26 and output transistor 30, form a current mirror which is necessary for operative control over transistor 30. That is, it provides the correct polarity of current to turn on transistor 30 upon the conduction of control transistor 26.

Transistor 34, connected in the manner indicated, functions as a current mirror sourcing the current of transistor 30 into the additional transistor 36, in turn connected in series with a transistor 38 between current source 20 and ground. In a similar manner, transistor 38 forms a current mirror to source the current of transistor 32. Accordingly, if both output transistors 30 and 32 start to conduct simultaneously, transistors 36 and 38 are rendered conductive. The current through transistors 36 and 38 adds to the source current of current source 20 and transistor 26 is thereby rapidly biased off, as is current mirror 40-42, which in turn assures rapid turnoff of transistor 30. Thus transistor 30 is assured of being turned off whenever transistor 32 is rendered conductive.

It will be readily appreciated that added transistors 34, 36 and 38 function in the manner of a conventional AND gate. If transistors 30 and 32 start to conduct, there is an output current through transistors 36 and 38 which assures transistor 30 is rendered non-conductive. This is a dynamic condition which occurs quickly and assures proper class B operation of the amplifier 10'.

It should be noted that, with the circuit arrangement of the present invention, low output voltages are successfully avoided. With the stacked complementary PNP-NPN transistors as disclosed serving as the output devices, virtually the full swing of the supply voltage is effected. Even with a one volt DC battery source, this should, in most cases, be more than adequate. This contrasts sharply with the restricted voltage swing, on the order of a few tenths of a volt, when utilizing stacked output transistors of the same type as, say for example, two NPN transistors. In the latter case, the biasing requirements effectively reduce the amount of output voltage swing to the order of magnitude above mentioned.

Accordingly, an improved low-voltage, complementary symmetry amplifier arrangement has been herein disclosed and described which utilizes current ratios rather than voltage levels to control conduction of stacked, complementary output transistors. The amplifier circuit operates effectively and efficiently on power supply voltages as low as one volt DC and the arrangement is such as to be easily adapted for integrated circuit implementation. The amplifier is designed for class B operation to avoid high stand-by currents and successfully avoids the necessity of a transformer component, found in previous prior art designs. This allows circuit fabrication in a minimum of volume and cost and provides longer battery life.

What is claimed is:

1. A low-voltage, complementary symmetry amplifier driver, comprising in combination:

a differential amplifier with first and second transistors, each having a current source coupled to a respective output collector electrode with common connected emitter electrodes being coupled to a reference potential through a third current source, said current sources coupled to said first and second transistors being unbalanced in current with respect to each other and collectively at least equal to the current in said third current source; and third and fourth transistors each having an output electrode and an input electrode connected to a respective output electrode of said first and second transistors of said differential amplifier, said third and fourth transistors being of the complementary type to said first and second transistors.

2. A low-voltage, complementary symmetry amplifier driver in accordance with claim 1 wherein said first and second transistors are of the NPN type and wherein said third and fourth transistors are of the PNP type.

3. A low-voltage, complementary symmetry amplifier driver in accordance with claim 1 wherein said current sources coupled to said first and second transistors are substantially equal and wherein the sum thereof substantially equals the current of said third current source.

4. A low-voltage, complementary symmetry amplifier, comprising in combination:

a differential amplifier having first and second transistors, each having a constant current source coupled to a respective output collector electrode with common connected emitter electrodes being coupled to a reference potential through a third constant current source, said constant current sources coupled to said first and second transistors being unbalanced in current with respect to each other and collectively at least equal to the current in said third constant current source; and third and fourth transistors each having an output electrode and an input electrode connected to a respective output electrode of said first and second transistors of said differential amplifier, said third and fourth transistors being of the complementary type to said first and second transistors; and fifth and sixth transistors serving as output devices, each having an input coupled to a respective output of said third and fourth transistors, said fifth and sixth transistors being complementary to one another and having common connected collector electrodes serving as the output of said amplifier arrangement.

5. A low-voltage, complementary symmetry amplifier in accordance with claim 4 wherein said first and second transistors are of the NPN type and said third and fourth transistors are of PNP type.

6. A low-voltage, complementary symmetry amplifier in accordance with claim 4 wherein said current sources coupled to said first and second transistors are substantially equal and wherein the sum thereof is substantially equal to the current of said third current source.

7. A low-voltage, complementary symmetry amplifier in accordance with claim 4 wherein said fifth and sixth transistors are serially connected between a source of supply voltage and a reference potential and wherein said fifth transistor is a PNP type and said sixth transistor is an NPN type.

8. A low-voltage, complementary symmetry amplifier in accordance with claim 7 wherein seventh and eighth transistors are connected as a current mirror between the output of said third transistor and the input to said fifth transistor.

9. A low-voltage, complementary symmetry amplifier in accordance with claim 8 wherein ninth and tenth transistors are serially connected between said current source coupled to said first transistor and a reference potential with the input of said tenth transistor being connected in parallel with the input of said sixth transistor and wherein an eleventh transistor is connected in parallel with said fifth transistor and having an output connected to the input of said ninth transistor.

10. A low-voltage, complementary symmetry amplifier in accordance with claim 9 wherein said ninth, tenth and eleventh transistors function as an AND gate providing an output when said fifth and sixth transistors both being to conduct.

11. A low-voltage, complementary symmetry amplifier in accordance with claim 9 wherein said tenth and eleventh transistors function as current mirrors sourcing the current of said fifth and sixth transistors respectively.

* * * * *